(12) United States Patent
Zhang et al.

(10) Patent No.: US 12,040,188 B2
(45) Date of Patent: Jul. 16, 2024

(54) PHOTORESIST STRUCTURE, PATTERNED DEPOSITION LAYER, SEMICONDUCTOR CHIP AND MANUFACTURING METHOD THEREOF

(71) Applicant: Tencent Technology (Shenzhen) Company Limited, Guangdong (CN)

(72) Inventors: Wenlong Zhang, Guangdong (CN); Yarui Zheng, Guangdong (CN); Shengyu Zhang, Guangdong (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 420 days.

(21) Appl. No.: 17/502,705

(22) Filed: Oct. 15, 2021

(65) Prior Publication Data
US 2022/0037148 A1 Feb. 3, 2022

Related U.S. Application Data

(63) Continuation of application No. PCT/CN2021/100057, filed on Jun. 15, 2021.

(30) Foreign Application Priority Data

Jul. 23, 2020 (CN) .......................... 202010717981.7

(51) Int. Cl.
*H01L 21/027* (2006.01)
*G03F 7/09* (2006.01)
(Continued)

(52) U.S. Cl.
CPC .......... *H01L 21/0272* (2013.01); *G03F 7/094* (2013.01); *G03F 7/162* (2013.01);
(Continued)

(58) Field of Classification Search
None
See application file for complete search history.

(56) References Cited

U.S. PATENT DOCUMENTS

| 4,533,624 A | 8/1985 | Sheppard |
| 2005/0277064 A1 | 12/2005 | Lamarre |

(Continued)

FOREIGN PATENT DOCUMENTS

| CN | 1688017 A | 10/2005 |
| CN | 101470355 A | 7/2009 |

(Continued)

OTHER PUBLICATIONS

Search Report for appln. No. CN 202010717981.7 dated Dec. 9, 2021, 4p., in Chinese language.

(Continued)

*Primary Examiner* — Feifei Yeung Lopez
(74) *Attorney, Agent, or Firm* — Crowell & Moring LLP

(57) ABSTRACT

Embodiments of this disclosure provide a photoresist structure, a patterned deposition layer, a semiconductor chip and a manufacturing method thereof According to the method for manufacturing a photoresist structure, a single photoresist is used, a second photoresist layer having an undercut can be obtained by only one development process using a single developing solution, and the size of the undercut can be controlled by the development time, thereby solving the problems such as difficulty in lift-off caused by adhesion of the deposited material to the sidewall of the photoresist structure in traditional lift-off processes.

16 Claims, 6 Drawing Sheets

(51) Int. Cl.
  *G03F 7/16* (2006.01)
  *G03F 7/20* (2006.01)
  *G03F 7/38* (2006.01)
(52) U.S. Cl.
  CPC ............ *G03F 7/168* (2013.01); *G03F 7/2022* (2013.01); *G03F 7/38* (2013.01)

(56) References Cited

U.S. PATENT DOCUMENTS

| | | | |
|---|---|---|---|
| 2009/0111061 A1 | 4/2009 | Chau et al. | |
| 2009/0233240 A1 | 9/2009 | Baik et al. | |
| 2017/0269424 A1 | 9/2017 | Long et al. | |
| 2022/0130784 A1* | 4/2022 | Zhang | G03F 7/2014 |

FOREIGN PATENT DOCUMENTS

| | | |
|---|---|---|
| CN | 101881927 A | 11/2010 |
| CN | 102136484 A | 7/2011 |
| CN | 103035492 A | 4/2013 |
| CN | 103094096 A | 5/2013 |
| CN | 103107067 A | 5/2013 |
| CN | 103107252 A | 5/2013 |
| CN | 103137441 A | 6/2013 |
| CN | 103137442 A | 6/2013 |
| CN | 105116685 A | 12/2015 |
| CN | 105334699 A | 2/2016 |
| CN | 105575892 A | 5/2016 |
| CN | 108735582 A | 11/2018 |
| CN | 111221226 A | 6/2020 |
| CN | 111399338 A | 7/2020 |
| CN | 112652522 A | 4/2021 |
| CN | 112652540 A | 4/2021 |
| JP | S 61156044 A | 7/1986 |
| JP | H 8-293454 A | 11/1996 |
| JP | H 09-270464 A | 10/1997 |
| JP | 2008-242247 A | 10/2008 |
| WO | WO 2008/035059 A2 | 3/2008 |
| WO | WO 2008/117696 A1 | 10/2008 |
| WO | WO 2019/055048 A1 | 3/2019 |

OTHER PUBLICATIONS

First Office Action for appln. No. CN 202010717981.7 dated Dec. 15, 2021, 4p, in Chinese language.
Concise Explanation of Relevance for C16 and C17.
Second Office Action for application No. CN 202010717981.7 dated Feb. 14, 2022, 4p, in Chinese language.
Concise Explanation of Relevance for D1.
Notice of Preliminary Rejection for corresponding Korean application No. 10-2021-7035960, dated Dec. 8, 2023, 3p, in Korean language.
English translation for Preliminary Rejection for corresponding Korean application No. 10-2021-7035960 dated Dec. 8, 2023, 3p.
International Search Report and Written Opinion for priority application No. PCT/CN2021/100057 dated Jun. 15, 2021, 11p, in Chinese language.
Concise Explanation of Relevance of International Search Report and Written Opinion for priority application No. PCT/CN2021/100057.
Notice of Reasons for Refusal for corresponding application No. JP 2021-564350 dated Nov. 22, 2022, 4p, in Japanese language.
English language translation for Notice of Reasons for Refusal for corresponding application No. JP 2021-564350 dated Nov. 22, 2022, 3p.
Extended European Search Report for application No. EP 21783120.5 dated Jul. 6, 2022, 10p.
Lee, Yong Hean et al., "Fine Tuning of Negative Photo-Resist Sidewall Profiles for Thick Metal Lift-Off in Applications of MEMS and Advanced Packaging", *IEEE, Institute of Electrical and Electronics Engineers*, 12th Electronics Packaging Technology Conference, Dec. 10, 2020, XP-031884601, pp. 338-342. Singapore.

* cited by examiner

PHOTORESIST STRUCTURE, PATTERNED DEPOSITION LAYER, SEMICONDUCTOR CHIP AND MANUFACTURING METHOD THEREOF

RELATED APPLICATION

This application is a continuation of International Patent Application No. PCT/CN2021/100057, filed Jun. 15, 2021, which claims priority to Chinese Patent Application No. 202010717981.7, entitled "Photoresist structure, patterned deposition layer, semiconductor chip and manufacturing method thereof" filed on Jul. 23, 2020. The above applications are incorporated by reference in their entireties.

TECHNICAL FIELD

The invention relates to the technical field of micro-nano processing, and in particular, to a photoresist structure, a patterned deposition layer and a semiconductor chip.

BACKGROUND

In the field of micro-nano processing technology, most of the processing techniques such as the lift-off process need to be realized by preparing a special photoresist structure.

Taking the lift-off process as an example, conventional technologies have the following problems. First, the sidewall of the deposited material is likely to adhere to the sidewall of the photoresist, resulting in poor morphology of the patterned deposition layer. Second, in the photoresist patterning process, the developing solution reacts with the substrate material, causing corrosion to the substrate material.

The first problem can usually be solved by preparing a photoresist structure having an undercut, but the photoresist structure having an undercut is likely to cause lateral diffusion of the bottom of the deposited material, resulting in that the actual size of the patterned deposition layer does not match the defined size.

In conventional technical solutions, the second problem can only be solved by selecting a photoresist that uses a developing solution that does not react with the substrate material, but this will reduce the compatibility of the process.

SUMMARY

In view of the shortcomings of the existing methods, this disclosure provides a photoresist structure, a patterned deposition layer, a semiconductor chip, and a manufacturing method thereof. When the method is used in a lift-off process, a good effect is achieved, and the size of the patterned deposition layer after lift-off is consistent with the defined pattern size.

According to one aspect, the embodiments of this disclosure provide a method for manufacturing a photoresist structure, including the following steps:
 forming a first photoresist layer on a substrate;
 performing first baking;
 forming a second photoresist layer on the first photoresist layer after the first baking;
 performing second baking;
 performing under exposure to the second photoresist layer after the second baking, a duration of the under exposure being less than a duration of full exposure of the second photoresist layer;
 performing third baking;
 developing and fixing the second photoresist layer after the third baking to obtain a partially patterned second photoresist layer, the partially patterned second photoresist layer comprising a first opening, the first opening comprising:
  a first part; and
  a second part located between the first part and the substrate, an aperture of the first part being smaller than an aperture of the second part, and an orthographic projection of the first part on the substrate is within an orthographic projection of the second part on the substrate;
 flood exposing the partially patterned second photoresist layer;
 performing fourth baking to obtain a patterned second photoresist layer; and
 etching the first photoresist layer using the patterned second photoresist layer as a mask to obtain a patterned first photoresist layer.

Exemplarily, the forming a first photoresist layer on a substrate, and performing first baking includes: forming the first photoresist layer on the substrate by spin coating, and baking the substrate formed with the first photoresist layer at a soft bake temperature of the first photoresist layer, where the first photoresist layer does not react with a developing solution for the second photoresist layer.

Exemplarily, the forming a second photoresist layer on the first photoresist layer after the first baking, and performing second baking includes: forming the second photoresist layer on a side of the first photoresist layer away from the substrate by spin coating, and performing the second baking at a soft bake temperature of the second photoresist layer.

Exemplarily, the partially exposing the second photoresist layer after the second baking, and performing third baking includes: partially exposing the substrate after the second baking, and performing the third baking for a pre-baking time or a reversal bake time of the second photoresist layer.

Exemplarily, the developing and fixing the second photoresist layer after the third baking includes: developing the second photoresist layer after the partial exposure and the third baking for a set time, followed by fixing, where the set time is at least 15 s longer than a development time of the second photoresist layer under full exposure.

Exemplarily, the flood exposing the partially patterned second photoresist layer, and performing fourth baking to obtain a patterned second photoresist layer includes: flood exposing the partially patterned second photoresist layer, and baking sequentially at a pre-baking temperature and a hardbake temperature of the partially patterned second photoresist layer, to obtain the patterned second photoresist layer.

Exemplarily, the etching the first photoresist layer using the patterned second photoresist layer as a mask includes: etching the first photoresist layer by physical etching and/or reactive-ion etching using the patterned second photoresist layer as a mask.

According to another aspect, the embodiments of this disclosure provide a method for manufacturing a patterned deposition layer, the method including:
 obtaining a photoresist structure, the photoresist structure being manufactured by the above-mentioned method for manufacturing a photoresist structure;
 forming a deposition layer on the patterned second photoresist layer and on the substrate exposed by the patterned first photoresist layer, a thickness of the deposition layer being less than a sum of a thickness of chip, the patterned first photoresist layer and a thickness of the patterned second photoresist layer; and removing the patterned first photoresist layer and the patterned second photoresist layer to obtain a patterned deposition layer.

According to another aspect, the embodiments of this disclosure provide a method for manufacturing patterned deposition layer, including:

a first photoresist layer, having a first aperture; and a second photoresist layer located at a side of the first photoresist layer opposite to the substrate, the second photoresist layer including an upper aperture distant from the first aperture and a lower aperture approximate to the first aperture, wherein a width of the first aperture is smaller than a width of the lower aperture, the width of the first aperture is larger or equal to the upper aperture, the width of the upper aperture is smaller than the width of the lower aperture;

forming a deposition layer on the second photoresist layer and on the substrate exposed by the first photoresist layer, a thickness of the deposition layer being less than a sum of a thickness of the first photoresist layer and a thickness of the second photoresist layer; and removing the first photoresist layer and the second photoresist layer to obtain a patterned deposition layer.

According to another aspect, the embodiments of this disclosure provide a method for manufacturing a semiconductor chip, a patterned deposition layer included in the semiconductor chip being manufactured by the above-mentioned method for manufacturing a patterned deposition layer.

According to another aspect, the embodiments of this disclosure provide a semiconductor chip, a patterned deposition layer included in the semiconductor chip being manufactured by the above-mentioned method for manufacturing a patterned deposition layer.

According to yet another aspect, the embodiments of this disclosure provide a computer device, including:

a processor, a communication interface, a memory, and a communication bus, the processor, the communication interface, and the memory communicating with each other by using the communication bus; and the communication interface being an interface of a communication module;

the memory being configured to store program code and transmit the program code to the processor; and the processor being configured to call instructions in the program code in the memory to execute the methods of the above aspects.

According to yet another aspect, an embodiment of this disclosure provides a storage medium, the storage medium being configured to store a computer program, the computer program being configured to execute the method according to the above aspect.

According to yet another aspect, an embodiment of this disclosure provides a computer program product including instructions, the computer program product, when run on a computer, causing the computer to execute the method according to the above aspect.

Compared with the prior art, the present invention has the following advantages and beneficial effects:

According to the photoresist structure, patterned deposition layer, semiconductor chip and manufacturing method thereof provided in this disclosure, by means of underexposure, a single photoresist is used, a second photoresist layer having an undercut can be obtained by only one development process using a single developing solution, and the size of the undercut can be controlled by the development time, thereby solving the problems such as difficulty in lift-off caused by adhesion of the deposited material to the sidewall of the photoresist structure in traditional lift-off processes. The use of the first photoresist layer as a protective resist layer can protect the substrate material from being corroded or damaged by the developing solution during development. The first photoresist layer serving as a protective resist layer is etched into a pattern restriction layer, which can effectively prevent the lateral diffusion of the bottom of the deposited material during the material deposition process, thereby obtaining a deposition layer with good morphology. In addition, the first photoresist layer and the second photoresist layer may be photoresists that can react with the same kind of resist removal solution to realize lift-off at a time, thereby reducing the difficulty of lift-off and the cost of lift-off.

Additional aspects and advantages of this disclosure will be given in part in the following description, and will become apparent from the following description or may be learned from practices of this disclosure.

BRIEF DESCRIPTION OF THE DRAWINGS

The foregoing and/or additional aspects and advantages of this disclosure will become obvious and easy to understand from the following descriptions of the embodiments with reference to the accompanying drawings.

LIST OF REFERENCE NUMERALS

Figure 1:
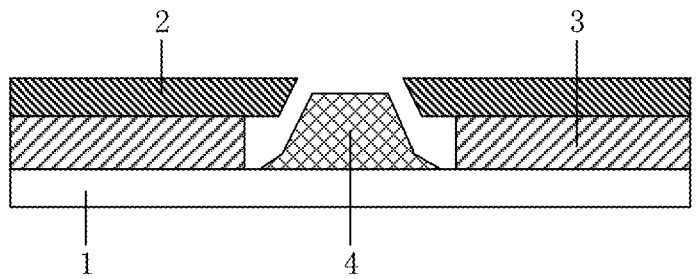
FIG. 1 is a schematic cross-sectional view of a photoresist structure having an undercut in the related art.

1—substrate; 2—first photoresist layer; 2'—patterned first photoresist layer; 201—second opening; 3—second photoresist layer; 3a—reacted part; 3b—unreacted part; 3'—patterned second photoresist layer; 301—first part; 302—second part; 4—deposition layer; 4'—patterned deposition layer; M—exposure mask.

DESCRIPTION OF EMBODIMENTS

This disclosure is described in detail below, and examples of the embodiments are shown in accompanying drawings, where the same or similar elements or the elements having same or similar functions are denoted by the same or similar reference numerals throughout the description. In addition, a detailed description of known technologies will be omitted if it is not necessary for the illustrated features of this disclosure. The embodiments that are described below with reference to the accompanying drawings are exemplary, and are only used to interpret this disclosure and cannot be construed as a limitation to this disclosure.

It may be understood by those skilled in the art that unless otherwise defined, all terms (including technical and scientific terms) used herein have the same meaning as commonly understood by one of ordinary skill in the art to which this disclosure belongs. The terms such as those defined in commonly used dictionaries are to be interpreted as having meanings that are consistent with the meanings in the context of the related art, and are not to be interpreted in an idealized or extremely formalized sense, unless expressively so defined herein.

A person skilled in the art may understand that, the singular forms "a", "an", "said", and "the" used herein may include the plural forms as well, unless the context clearly indicates otherwise. It is to be further understood that, the terms "include" and/or "comprise" used in this specification of this disclosure refer to the presence of stated features, integers, steps, operations, elements, and/or components, but do not preclude the presence or addition of one or more other features, integers, steps, operations, elements, components, and/or combinations thereof.

First, several terms included in this disclosure are described and explained.

Undercut: It is a photoresist structure and often refers to a structure having a bottom wider than its top, with its sidewall gradually expanding outward from the top to the bottom. The cross-section of the photoresist is in the shape of a regular trapezoid, and may also be in a shape of two stacked rectangles, where the bottom one is wider that the top one.

Underexposure: It means that the exposure time for the photoresist is less than the time required for the photoresist with the thickness to completely react.

Flood exposure: Full exposure of the photoresist on the substrate.

Considering that the deposited material is likely to adhere to the sidewall of the photoresist in the process of obtaining the patterned deposition layer, the related technologies adopt a photoresist structure having an undercut to prevent the deposited material from adhering to the sidewall of the photoresist. However, the photoresist structure having an undercut is likely to cause lateral diffusion of the bottom of the deposited material, affecting the size of the patterned deposition layer, and reducing the performance of the chip prepared.

Specifically, in a related technology, as shown in FIG. 1, a second photoresist layer 3 and a first photoresist layer 2 are sequentially formed on a substrate 1. The first photoresist layer 2 and the second photoresist layer 3 are formed with an undercut. Although the undercut can prevent the deposition layer 4 from adhering to the photoresist, lateral diffusion of the bottom of the deposition layer 4 is caused. As a result, the size of the bottom of the finally obtained deposition layer 4 of a specific shape is larger, and is different from the pre-designed size of the deposition layer 4 of the specific shape.

The photoresist structure, patterned deposition layer, semiconductor chip and manufacturing method thereof provided by the embodiments of this disclosure may solve the technical problems of the related technologies.

The embodiments provided in this disclosure can be implemented by various processing equipment involved in the field of micro-nano processing technology. The processing equipment can implement various functions required for manufacture of a photoresist structure, manufacture of a patterned deposition layer, and manufacture of a semiconductor chip in the field of micro-nano processing technology.

The processing equipment may include a homogenizer, a lithography machine (for example, an ultraviolet lithography machine, etc.), and an etching equipment (for example, a March resist remover, etc.).

The following describes the technical solutions of this disclosure and how to resolve the foregoing technical issues according to the technical solutions of this disclosure in detail by using specific embodiments.

Figure 2:
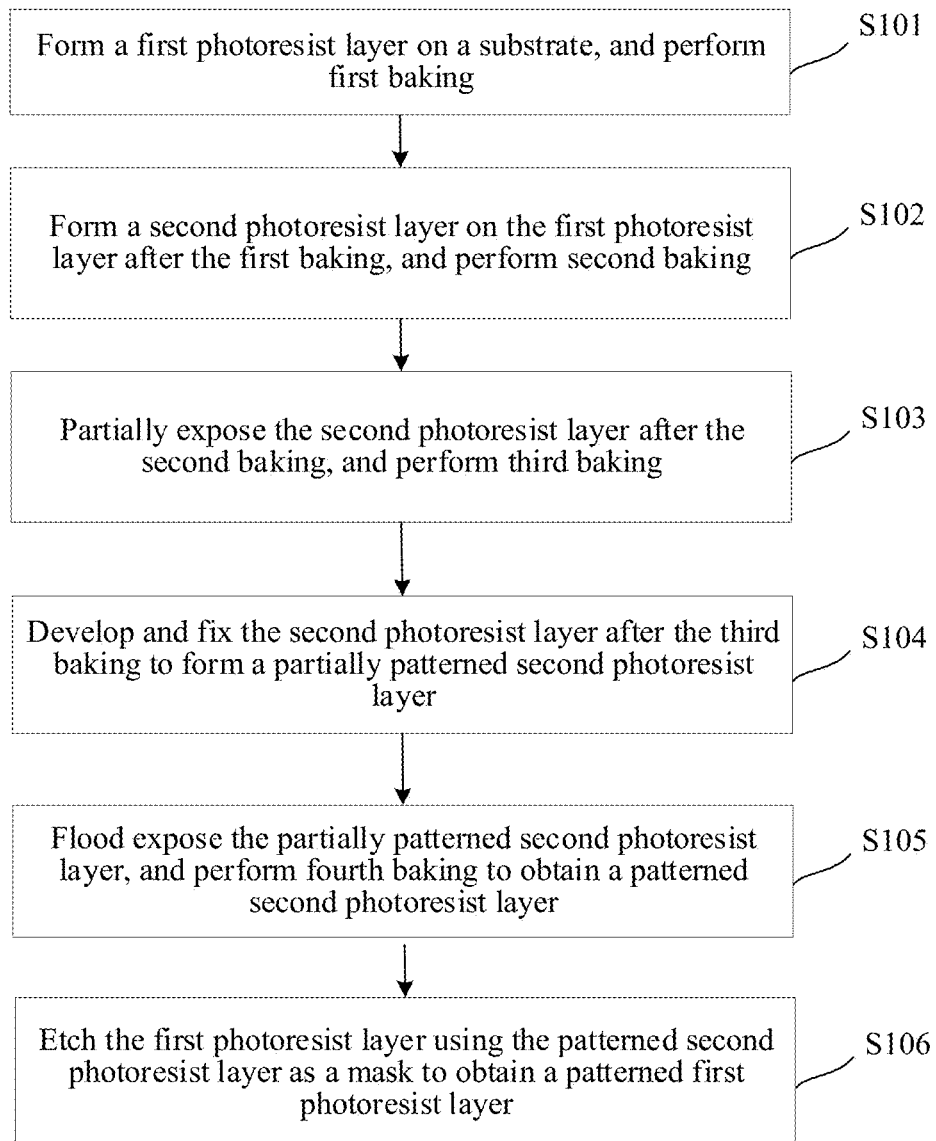
FIG. 2 is a schematic flowchart of a method for manufacturing a photoresist structure according to an embodiment of this disclosure.
Figure 3:
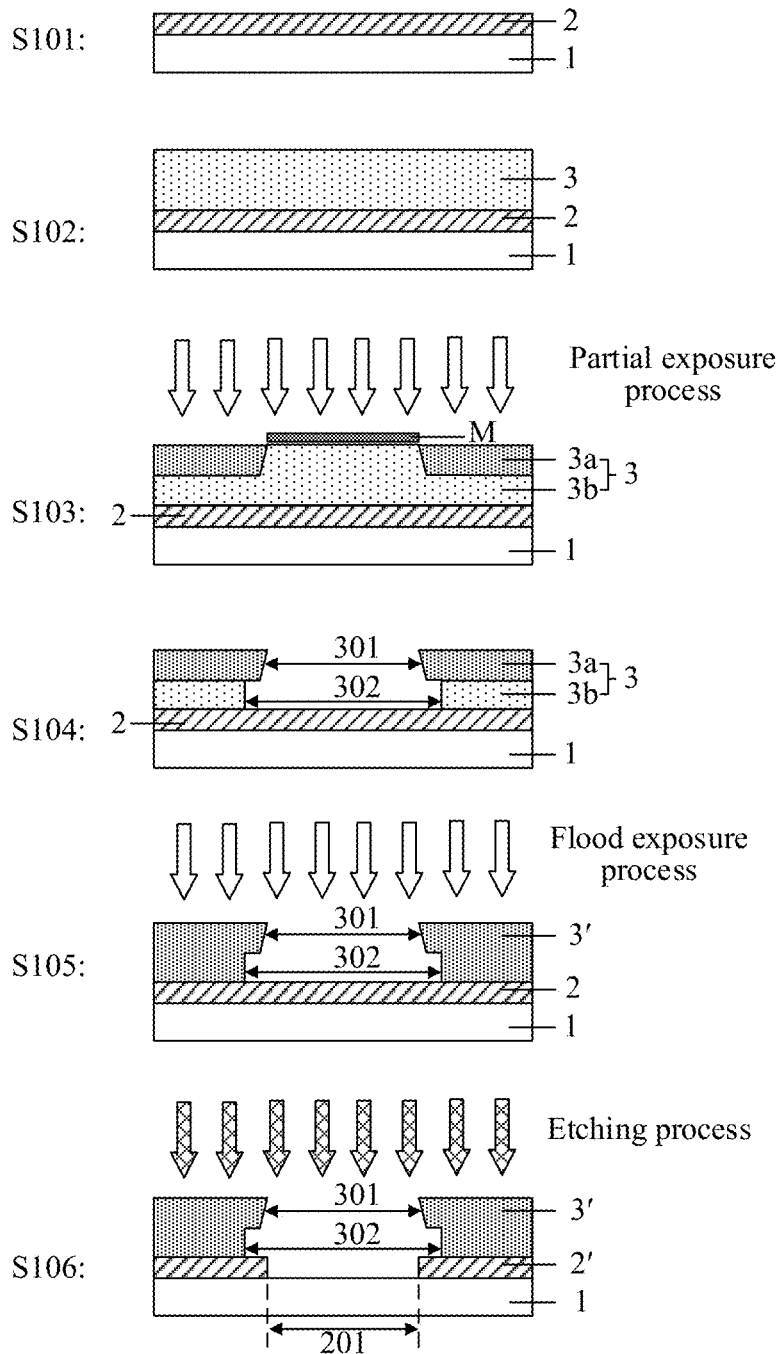
FIG. 3 is a schematic process diagram of the method for manufacturing a photoresist structure shown in FIG. 2.

An embodiment of this disclosure provides a method for manufacturing a photoresist structure. The method may be implemented by the processing equipment. As shown in FIG. 2 and FIG. 3, the method includes the following steps.

S101: Form a first photoresist layer 2 on a substrate 1, and performing first baking.

Specifically, in this step, the first photoresist layer 2 is formed on the substrate 1 by spin coating, and the substrate 1 formed with the first photoresist layer 2 is baked at a soft bake temperature of the first photoresist layer 2, where the first photoresist layer 2 does not react with a developing solution for a second photoresist layer 3. In this way, the first photoresist layer 2 can protect the substrate 1 during the development of the second photoresist layer 3, thereby preventing the substrate 1 from being corroded by the developing solution. Further, the provided substrate 1 should be clean, so as to provide good bonding between the substrate 1 and the film layer on the substrate.

S102: Form a second photoresist layer 3 on the first photoresist layer 2 after the first baking, and perform second baking.

Specifically, in this step, the second photoresist layer 3 is formed on a side of the first photoresist layer 2 away from the substrate 1 by spin coating, and the second baking is performed at a soft bake temperature of the second photoresist layer 3.

S103: Partially/Under expose the second photoresist layer 3 after the second baking, and perform third baking.

A duration of the partial/under exposure is less than a duration of full exposure of the second photoresist layer 3.

Specifically, in this step, the second photoresist layer 3 is partially exposed after the second photoresist layer 3 is baked, and the third baking is performed for a pre-baking time or a reversal baking time of the second photoresist layer 3. As shown in FIG. 3, the partial exposure may be implemented with an optical mask M. In an example where the second photoresist layer 3 is a negative photoresist, because the duration of exposure in this step is less than the duration of full exposure of the second photoresist layer 3, that is, the second photoresist layer 3 is underexposed, the part of the second photoresist layer 3 distant from the substrate 1 reacts, and its properties being changed and becomes a reacted part 3a of the second photoresist layer 3; the part of the second photoresist layer 3 approximate to the substrate 1 does not react, and it becomes an unreacted part 3b of the second photoresist layer 3. That is, through underexposure, the partially exposed second photoresist layer 3 has two parts: one that can be dissolved by the developing solution and the other that cannot be dissolved by the developing solution.

S104: Develop and fix the second photoresist layer 3 after the third baking to obtain a partially patterned second photoresist layer 3.

The partially patterned second photoresist layer 3 includes a first opening. The first opening corresponds to an exposure area or a light-shielding area of the partial exposure where was masked by the mask M. The first opening includes a first part 301 and a second part 302 located on a side of the first part 301 close to the substrate 1. An aperture of the first part 301 is smaller than an aperture of the second part 302. An orthographic projection of the first part 301 on the substrate 1 is within an orthographic projection of the second part 302 on the substrate 1.

Specifically, if the second photoresist layer 3 is a positive photoresist, the first opening corresponds to the exposure area of the partial exposure in S103. If the second photoresist layer 3 is a negative photoresist, the first opening corresponds to the light-shielding area of the partial exposure in S103.

Specifically, in this step, the second photoresist layer 3 after the exposure and the third baking is developed for a set time, followed by fixing, where the set time is at least 15 s longer than a development time when the second photoresist layer 3 would have been fully exposed. With the longer development time, an undercut can be formed in the second photoresist layer 3, thereby preventing the deposited material from adhering to the sidewall of the photoresist. The size of the undercut can be controlled by adjusting the development time.

S105: Flood exposing the partially patterned second photoresist layer 3, and performing fourth baking to obtain a patterned second photoresist layer.

Specifically, in this step, the partially patterned second photoresist layer 3 (at this time, the unreacted part 3b of the second photoresist layer 3 has not been patterned) is flood exposed, and is baked sequentially at a pre-baking temperature and a hard baking temperature of the partially patterned second photoresist layer 3. The second photoresist layer 3 is flood exposed so that the unreacted part 3b of the second photoresist layer 3 reacts under light conditions, and the fourth baking is performed to harden the patterned second photoresist layer 3.

Since the unreacted part 3b of the second photoresist layer 3 is likely to react with oxygen or other gases in the subsequent etching process to cause a change in size, while the reacted part 3a does not react with the gases in the etching process. Therefore, by the flood exposure of the partially patterned second photoresist layer 3, the unreacted portion 3b can be fully reacted to obtain a fully reacted patterned second photoresist layer 3', thereby ensuring that the undercut structure has the preset size.

S106: Etch the first photoresist layer 2 using the patterned second photoresist layer 3' as a mask to obtain a patterned first photoresist layer 2'.

Specifically, the patterned first photoresist layer 2' includes a second opening 201, an aperture of the second opening 201 is smaller than the aperture of the second part 302 and greater than or equal to the aperture of the first part 301, and an orthographic projection of the second opening 201 on the substrate 1 is within an orthographic projection of the second part 302 on the substrate 1.

Specifically, in this step, the first photoresist layer 2 is etched by physical etching or reactive-ion etching using the patterned second photoresist layer 3' as a mask. The use of the obtained patterned first photoresist layer 2' as a pattern restriction resist layer can effectively prevent lateral diffusion at the bottom of the deposited material during the material deposition process, thereby obtaining a patterned deposition layer having an actual size the same as the preset size.

Figure 8:
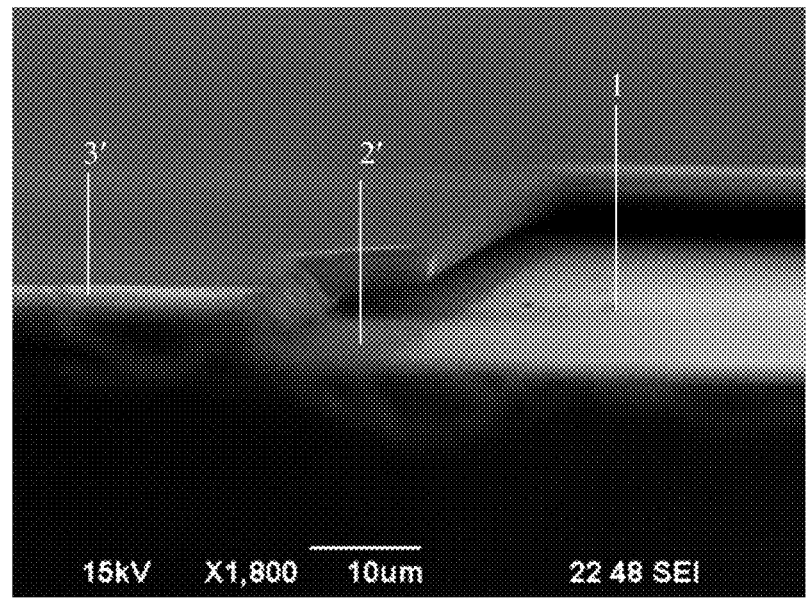
FIG. 8 is an electron scanning electron microscope image of a photoresist structure after etching according to an embodiment of this disclosure.
Figure 9:
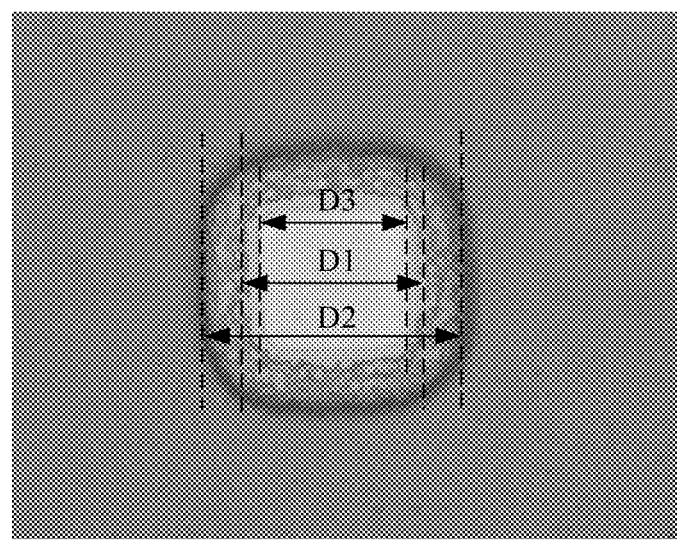
FIG. 9 is a schematic top view of a photoresist structure after etching according to an embodiment of this disclosure.

A photoresist structure manufactured by the method for manufacturing a photoresist structure in the above embodiment is shown in FIG. 8 and FIG. 9. The photoresist structure includes a patterned first photoresist layer 2 and a patterned second photoresist layer 3'. The patterned first photoresist layer 2' serves as a pattern restriction layer to prevent lateral diffusion at the bottom of the deposited material, and the patterned second photoresist layer 3' includes an undercut to prevent the deposited material from adhering to the sidewall of the photoresist structure.

Figure 5:
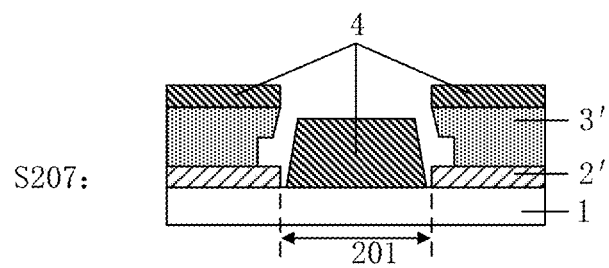
FIG. 5 is a schematic process diagram of the processes of S207 and S208 in the method for manufacturing a patterned deposition layer shown in FIG. 4.
Figure 5:
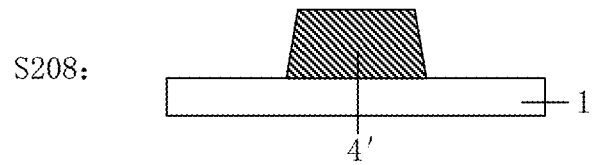

Specifically, as shown in FIG. 9 and referring to FIG. 3 and FIG. 5, D1 is the size of the second opening 201 in the patterned first photoresist layer 2', that is, the size of the pattern restriction layer; D2 is the size of the second part 302 of the first opening in the patterned second photoresist layer 3', that is, the size of the undercut; D3 is a defined size of a patterned deposition layer 4'.

Specifically, as shown in FIG. 8 and FIG. 9 and referring to FIG. 3, the photoresist structure includes a patterned first photoresist layer 2' and a patterned second photoresist layer 3' located on the substrate 1. The patterned first photoresist layer 2' includes a plurality of second openings 201, and the patterned second photoresist layer 3' includes first openings corresponding one-to-one to the second openings 201. The first openings each include a first part 301 and a second part 302 located on a side of the first part 301 close to the substrate 1. An aperture of the first part 301 is smaller than an aperture of the second part 302. An orthographic projection of the first part 301 on the substrate 1 is within an orthographic projection of the second part 302 on the substrate 1. An aperture of the second opening 201 is smaller than the aperture of the second part 302 and greater than or equal to the aperture of the first part 301. An orthographic projection of the second opening 201 on the substrate 1 is within an orthographic projection of the second part 302 on the substrate 1. The photoresist structure not only can effectively prevent lateral diffusion at the bottom of the deposited material during the material deposition process, thereby obtaining a patterned deposition layer having an actual size the same as the preset size, but also can prevent the deposited material from adhering to the sidewall of the photoresist, thereby obtaining a patterned deposition layer with a good surface morphology.

Figure 7:
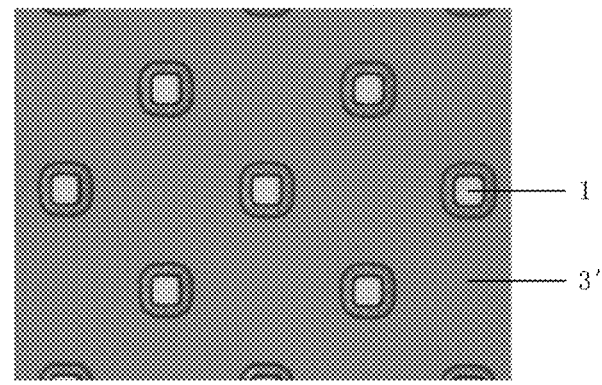
FIG. 7 is a schematic top view of a photoresist structure after etching according to an embodiment of this disclosure.

For ease of understanding, the following embodiment provides a specific method for manufacturing a photoresist structure. A photoresist structure finally obtain is shown in FIG. 7. Referring to FIG. 3, this specific embodiment includes the following step:

Step 101: Place a cleaned substrate, such as an aluminum substrate, on a spin-coating homogenizer, use a dropper to suck a polymethyl methacrylate (PMMA) resist, namely, acrylic resist, and drop it to the center of the aluminum substrate, run the homogenizer first at 300 rpm-800 rpm for 1 s-5 s and then at a 1000 rpm-6000 rpm for 30 s-60 s to obtain a first photoresist layer 2; then place the aluminum substrate with the homogenized resist on a heating plate, and bake at a soft baking temperature of the PMMA resist (180° C.) for 120 s.

Step 102: Place the aluminum substrate obtained after step 101 on the spin-coating homogenizer, use a dropper to suck up a negative photoresist, drop it to the center of the aluminum substrate, and run the homogenizer first at 300 rpm-500 rpm for 1 s-5 s and then at 500 rpm-6000 rpm for 30 s-60 s to form a second photoresist layer 3; then place the aluminum substrate with the homogenized resist on the heating plate, and bake at a soft baking temperature of the negative photoresist, for example, at a certain temperature in the range of 90° C. to 115° C., for a certain period of time, for example, 30 s-120 s.

Step 103: Use an ultraviolet lithography machine to underexpose the aluminum substrate spin-coated with the two layers of resists, where the time of underexposure is less than the time for full exposure of the negative photoresist of the corresponding thickness that is obtained in step 102. For example, for a 5 μm thick negative resist, the time for full exposure is 2.5 s, and the time for underexposure is 1.2 s; then place the underexposed substrate on a hot plate and bake at a certain temperature for a certain period of time, for example, bake at 110° C. for 90 s.

Figure 6:
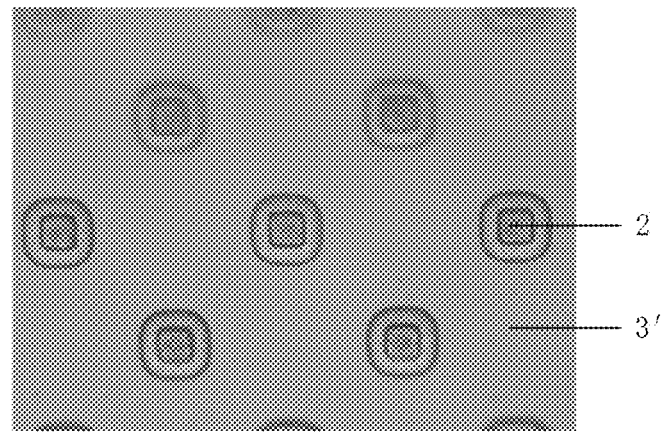
FIG. 6 is a schematic top view of a photoresist structure before etching according to an embodiment of this disclosure.

Step 104: Place the aluminum substrate obtained after step 103 in a developing solution for the negative photoresist, for example, a 2.38% concentration of tetramethylammonium hydroxide (TMAH) solution for development, where the development time is at least 15 s longer than the time for full development, for example, the development time is 80 s-150 s; then fix the substrate in deionized water for 30 s-180 s. In this process, PMMA does not react with TMAH, which can protect the aluminum substrate from contact with the alkaline TMAH solution, thereby preventing the aluminum substrate from being corroded by the alkaline TMAH solution. As shown in FIG. 6, before the etching step (step 105), each defined pattern includes a first photoresist layer 2 (PMMA resist) as a protective resist layer.

Step 105: Use the ultraviolet lithography machine to flood expose the aluminum substrate obtained after step 4, where the exposure time is, for example, 30 s-180; then place the aluminum substrate on the hot plate and bake sequentially at the pre-baking and post-baking temperatures of the negative photoresist used as the second photoresist layer 3, for example, bake first at 110° C. for 90 s (seconds) and then at 110° C. for 60 s.

Step 106: Place the aluminum substrate obtained after step 105 in an etching equipment, such as a March resist remover, and etch for 3 min at a power of 300 W in an oxygen environment to obtain a photoresist structure shown in FIG. 8. The photoresist structure includes a patterned first photoresist layer 2' and a patterned second photoresist layer 3'. In the photoresist structure, the patterned first photoresist layer 2' is a pattern restriction layer, and the patterned second photoresist layer 3' includes an undercut. As shown in FIG. 7, the first photoresist layer 2 (PMMA resist) in each defined pattern is completely etched within the range of the defined pattern.

The above specific embodiments show a method for manufacturing a photoresist structure based on a negative photoresist and a PMMA resist. In a specific implementation, the thickness of the negative photoresist may be changed by changing the rotation speed during resist homogenization, and the size of the undercut may be changed by changing the exposure and development time. This method can meet different requirements of processing technologies, has high flexibility and is suitable for processes such as deposition, etching, and lift-off.

Based on the same inventive concept, the embodiments of this disclosure also provide a method for manufacturing a patterned deposition layer. The method for manufacturing a patterned deposition layer includes the method for manufacturing a photoresist structure in the above-mentioned embodiment, and therefore has the beneficial effects of the embodiment of the method for manufacturing a photoresist structure, which will not be repeated here.

Figure 4:
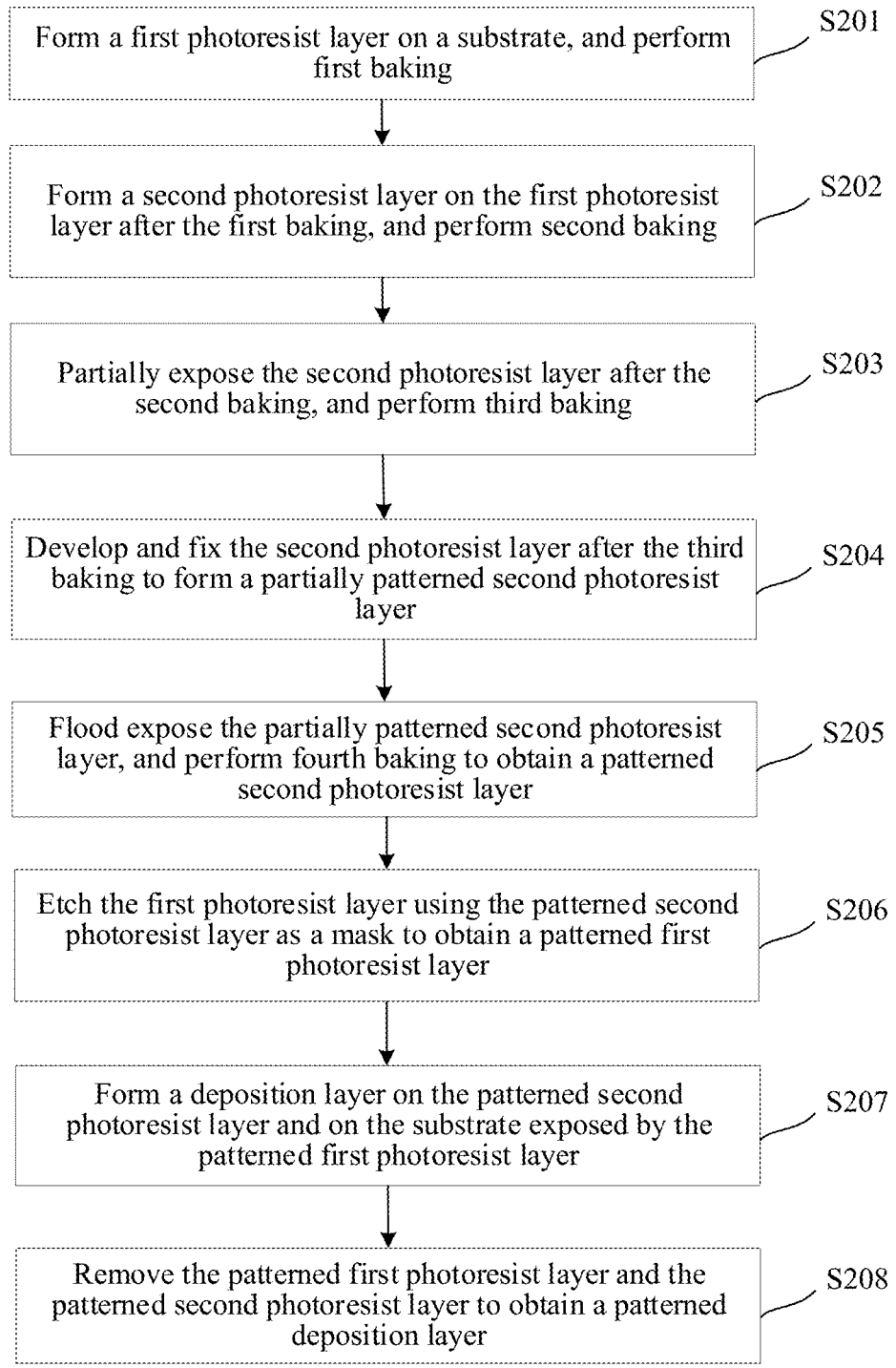
FIG. 4 is a schematic flowchart of a method for manufacturing a patterned deposition layer according to an embodiment of this disclosure.

Specifically, as shown in FIG. 4, S201 to S206 in the method for manufacturing a patterned deposition layer of this embodiment respectively correspond to S101 to S106 in the embodiment of the method for manufacturing a photoresist structure.

Specifically, as shown in FIG. 4 and FIG. 5, the method for manufacturing a patterned deposition layer of this embodiment further includes:

S207: Form a deposition layer 4 on the patterned second photoresist layer 3' and on the substrate 1 exposed by the patterned first photoresist layer.

A thickness of the deposition layer 4 is less than a sum of a thickness of the patterned first photoresist layer 2' and a thickness of the patterned second photoresist layer 3'.

Specifically, by controlling the thickness of the patterned first photoresist layer 2' and the patterned second photoresist layer 3', the thickness of the deposition layer 4 is made smaller than the sum of the thickness of the patterned first photoresist layer 2' and the thicknesses of the patterned second photoresist layer 3', so that the deposition layer 4 on the patterned second photoresist layer 3' is disconnected from the deposition layer 4 on the exposed substrate 1. In this way, the deposition layer 4 on the patterned second photoresist 3' can be removed at the same time by removing the photoresist.

S208: Remove the patterned first photoresist layer 2' and the patterned second photoresist layer 3' to obtain a patterned deposition layer 4'.

Specifically, the substrate 1 formed with the deposition layer 4 is placed in a lift-off solution, and the first photoresist layer 2' and the patterned second photoresist layer 3' are removed at a temperature of 20 to 80° C. to obtain the patterned deposition layer 4'.

Figure 10:
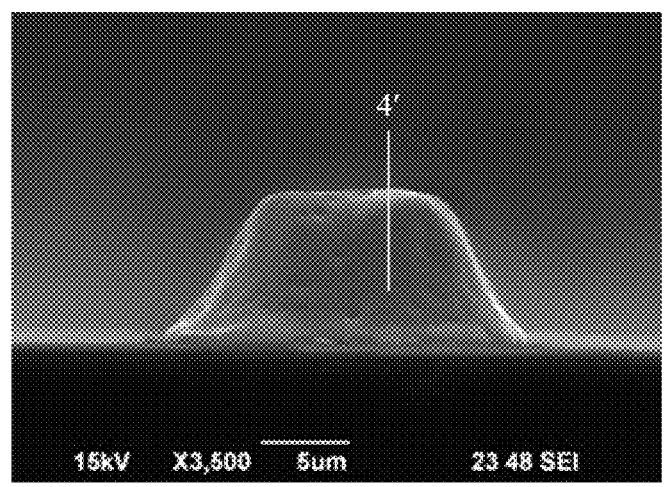
FIG. 10 is an electron scanning electron microscope image of a patterned deposition layer according to an embodiment of this disclosure.

As shown in FIG. 10, the patterned deposition layer 4' obtained by the manufacturing method provided by this embodiment has a smooth surface, has a good surface morphology, and no lateral diffusion, and can be of the same size as the preset size.

In the method for fabricating a patterned deposition layer provided in this embodiment, the first photoresist layer 2 and the second photoresist layer 3 can be photoresist that can react with the same kind of resist removal solution to achieve one-time peeling. Thereby reducing the peeling difficulty and peeling cost.

Specifically, the deposition layer may be a metal deposition layer. For example, the deposition layer may be a source/drain electrode, an indium pillar, etc. in a chip. The deposition layer may also be a non-metal deposition layer. For example, the deposition layer may be a non-metallic insulation structure located between two conductive layers to bridge the two conductive layers.

In the method for fabricating a patterned deposition layer provided in this embodiment, the first photoresist layer 2 and the second photoresist layer 3 may be photoresists that can react with the same kind of resist removal solution to realize lift-off at a time, thereby reducing the difficulty of lift-off and the cost of lift-off.

Based on the same inventive concept, the embodiments of this disclosure also provide a method for manufacturing a semiconductor chip. The method for manufacturing a semiconductor chip includes the method for manufacturing a patterned deposition layer in the above-mentioned embodiment, and therefore has the beneficial effects of the embodiment of the method for manufacturing a patterned deposition layer, which will not be repeated here.

Specifically, the method for manufacturing a semiconductor chip provided in this embodiment further includes steps such as cutting and packaging, which will not be detailed here because the points of invention of this disclosure do not involve processes such as cutting and packaging of the semiconductor chip.

Based on the same inventive concept, the embodiments of this disclosure also provide a semiconductor chip. A patterned deposition layer included in the semiconductor chip provided in this embodiment is manufactured by the method for manufacturing a patterned deposition layer in the above-mentioned embodiment, and therefore has the beneficial effects of the embodiment of the method for manufacturing a patterned deposition layer, which will not be repeated here.

By applying the embodiments of this disclosure, at least the following beneficial effects can be achieved:

According to the photoresist structure, patterned deposition layer, semiconductor chip and manufacturing method thereof provided in this disclosure, a single photoresist is used, a second photoresist layer having an undercut can be obtained by only one development process using a single developing solution, and the size of the undercut can be controlled by the development time, thereby solving the problems such as difficulty in lift-off caused by adhesion of the deposited material to the sidewall of the photoresist structure in traditional lift-off processes. The use of the first photoresist layer as a protective resist layer can protect the substrate material from being corroded or damaged by the developing solution during development. The first photoresist layer, serving as a protective resist layer, is etched to be a pattern restriction layer, which can effectively prevent the lateral diffusion of the bottom of the deposited material during the material deposition process, thereby obtaining a deposition layer with good morphology. In addition, the first photoresist layer and the second photoresist layer may be photoresists that can react with the same kind of resist removal solution to realize lift-off at a time, thereby reducing the difficulty of lift-off and the cost of lift-off.

In addition, the embodiments of this disclosure further provide a storage medium, the storage medium being configured to store a computer program, the computer program being configured to execute the method in the foregoing embodiments.

The embodiments of this disclosure further provide a computer program product including instructions, the instructions, when run on a computer, causing the computer to execute the method according to the foregoing embodiments.

It may be understood by a person skilled in the art that the steps, measures, and solutions in various operations, methods, and processes that have been discussed in this disclosure can be interchanged, modified, combined, or deleted. Further, other steps, measures, and solutions in various operations, methods, and processes that have been discussed in this disclosure can be interchanged, modified, rearranged, decomposed, combined, or deleted. Further, the steps, measures, and solutions in various operations, methods, and processes disclosed in this disclosure in the related art can be interchanged, modified, rearranged, decomposed, combined, or deleted.

In the description of this disclosure, it is to be understood that a direction or location relationship indicated by a term "center", "on", "under", "front", "rear", "left", "right", "vertical", "horizontal", "top", "bottom", "inner", "outer", or the like is a direction or location relationship shown based on the accompanying drawings, and is intended only conveniently describe this disclosure and simplify the description, but is not intended to indicate or imply that a mentioned apparatus or element needs to have a particular direction and is constructed and operated in the particular direction. Therefore, the direction or location relationship cannot be understood as a limitation on this disclosure.

The terms "first" and "second" are used merely for the purpose of description, and shall not be construed as indicating or implying relative importance or implying a quantity of indicated technical features. Therefore, a feature limited by "first" or "second" may explicitly or implicitly include one or more of the features. In the description of this disclosure, unless otherwise stated, "a plurality of" means two or more than two.

In the description of this disclosure, it should be noted that unless otherwise explicitly specified or defined, the terms such as "mount", "connect", and "connection" should be understood in a broad sense. For example, the connection may be a fixed connection, a detachable connection, or an integral connection; or the connection may be a direct connection, an indirect connection through an intermediary, or internal communication between two components. A person of ordinary skill in the art may understand the specific meanings of the foregoing terms in this disclosure according to specific situations.

In the descriptions of this specification, the described specific features, structures, materials, or characteristics may be combined in a proper manner in any one or more of the embodiments or examples.

It is to be understood that, although the steps in the flowchart in the accompanying drawings are sequentially shown according to indication of an arrow, the steps are not necessarily sequentially performed according to a sequence indicated by the arrow. Unless explicitly specified in this specification, execution of the steps is not strictly limited in the sequence, and the steps may be performed in other sequences. In addition, at least some steps in the flowcharts in the accompanying drawings may include a plurality of substeps or a plurality of stages. The substeps or the stages are not necessarily performed at the same moment, but may be performed at different moments. The substeps or the stages are not necessarily performed in sequence, but may be performed in turn or alternately with another step or at least some of substeps or stages of the another step.

The foregoing descriptions are some implementations of this disclosure. A person of ordinary skill in the art may make several improvements and refinements without departing from the principle of this disclosure, and the improvements and refinements shall fall within the protection scope of this disclosure.

What is claimed is:

1. A method for manufacturing a photoresist structure, the method being performed by a processing device and comprising:
   forming a first photoresist layer on a substrate;
   performing first baking;
   forming a second photoresist layer on the first photoresist layer after the first baking;
   performing second baking;
   performing under exposure to the second photoresist layer after the second baking, a duration of the under exposure being less than a duration of full exposure of the second photoresist layer;
   performing third baking;

developing and fixing the second photoresist layer after the third baking to obtain a partially patterned second photoresist layer, the partially patterned second photoresist layer comprising a first opening, the first opening corresponding to an exposure area or a light-shielding area for the under exposure and comprising:
a first part; and
a second part, an aperture of the first part being smaller than an aperture of the second part, and an orthographic projection of the first part on the substrate is within an orthographic projection of the second part on the substrate;
fully exposing the partially patterned second photoresist layer;
performing fourth baking to obtain a patterned second photoresist layer; and
etching the first photoresist layer using the patterned second photoresist layer as a mask to obtain a patterned first photoresist layer.

2. The method according to claim 1, wherein:
forming the first photoresist layer on the substrate comprises forming the first photoresist layer on the substrate by spin coating;
performing first baking comprises baking the substrate formed with the first photoresist layer at a soft bake temperature of the first photoresist layer; and
the first photoresist layer does not react with a developing solution for the second photoresist layer.

3. The method according to claim 1, wherein:
forming the second photoresist layer on the first photoresist layer after the first baking comprises forming the second photoresist layer on a side of the first photoresist layer away from the substrate by spin coating; and
performing second baking comprises performing the second baking at a soft bake temperature of the second photoresist layer.

4. The method according to claim 1, wherein:
performing the under exposure to the second photoresist layer after the second baking comprises partially exposing the second photoresist layer after the second baking; and
performing third baking comprises performing the third baking for a pre-baking time or a reversal baking time of the second photoresist layer.

5. The method according to claim 1, wherein developing and fixing the second photoresist layer after the third baking comprises:
developing the second photoresist layer after the exposure and the third baking for a pre-set time, followed by fixing, wherein the pre-set time is at least 15 seconds longer than a reference development time for fully exposing the second photoresist layer.

6. The method according to claim 1, wherein fully exposing the partially patterned second photoresist layer comprises fully exposing the partially patterned second photoresist layer, and baking sequentially at a pre-baking temperature and performing fourth baking to obtain the patterned second photoresist layer comprises baking sequentially at a pre-baking temperature and a hard bake temperature of the partially patterned second photoresist layer to obtain the patterned second photoresist layer.

7. The method according to claim 1, wherein etching the first photoresist layer using the patterned second photoresist layer as the mask comprises:
etching the first photoresist layer by physical etching and/or reactive-ion etching using the patterned second photoresist layer as the mask.

8. A method for manufacturing a patterned deposition layer, the method comprising:
obtaining a photoresist structure by performing steps comprising:
forming a first photoresist layer on a substrate;
performing first baking;
forming a second photoresist layer on the first photoresist layer after the first baking;
performing second baking;
performing under exposure to the second photoresist layer after the second baking, a duration of the under exposure being less than a duration of full exposure of the second photoresist layer;
performing third baking;
developing and fixing the second photoresist layer after the third baking to obtain a partially patterned second photoresist layer, the partially patterned second photoresist layer comprising a first opening, the first opening corresponding to an exposure area or a light-shielding area for the under exposure and comprising:
a first part; and
a second part, an aperture of the first part being smaller than an aperture of the second part, and an orthographic projection of the first part on the substrate is within an orthographic projection of the second part on the substrate;
fully exposing the partially patterned second photoresist layer;
performing fourth baking to obtain a patterned second photoresist layer; and
etching the first photoresist layer using the patterned second photoresist layer as a mask to obtain a patterned first photoresist layer;
forming a deposition layer on the patterned second photoresist layer and on the substrate exposed through the patterned first photoresist layer, a thickness of the deposition layer being less than a sum of a thickness of the patterned first photoresist layer and a thickness of the patterned second photoresist layer; and
removing the patterned first photoresist layer and the patterned second photoresist layer to obtain a patterned deposition layer.

9. The method according to claim 8, wherein:
forming the first photoresist layer on the substrate comprises forming the first photoresist layer on the substrate by spin coating;
performing first baking comprises baking the substrate formed with the first photoresist layer at a soft bake temperature of the first photoresist layer; and
the first photoresist layer does not react with a developing solution for the second photoresist layer.

10. The method according to claim 8, wherein:
forming the second photoresist layer on the first photoresist layer after the first baking comprises forming the second photoresist layer on a side of the first photoresist layer away from the substrate by spin coating; and
performing second baking comprises performing the second baking at a soft bake temperature of the second photoresist layer.

11. The method according to claim 8, wherein:
performing the under exposure to the second photoresist layer after the second baking comprises partially exposing the second photoresist layer after the second baking; and performing third baking comprises performing the third baking for a pre-baking time or a reversal baking time of the second photoresist layer.

12. The method according to claim 8, wherein developing and fixing the second photoresist layer after the third baking comprises:
developing the second photoresist layer after the exposure and the third baking for a pre-set time, followed by fixing, wherein the pre-set time is at least 15 seconds longer than a reference development time for fully exposing the second photoresist layer.

13. The method according to claim 8, wherein fully exposing the partially patterned second photoresist layer comprises fully exposing the partially patterned second photoresist layer, and baking sequentially at a pre-baking temperature and performing fourth baking to obtain the patterned second photoresist layer comprises baking sequentially at a pre-baking temperature and a hard bake temperature of the partially patterned second photoresist layer to obtain the patterned second photoresist layer.

14. The method according to claim 8, wherein etching the first photoresist layer using the patterned second photoresist layer as the mask comprises:
etching the first photoresist layer by physical etching and/or reactive-ion etching using the patterned second photoresist layer as the mask.

15. A computer device, comprising:
a processor, a communication interface, a memory, and a communication bus,
the processor, the communication interface, and the memory communicating with each other by using the communication bus; and the communication interface being an interface of a communication module;
the memory being configured to store program code and transmit the program code to the processor; and
the processor being configured to call instructions in the program code in the memory to execute the method for manufacturing a patterned deposition layer according to claim 8.

16. A storage medium, configured to store a computer program, the computer program being configured to execute the method for manufacturing a patterned deposition layer according to claim 8.

\* \* \* \* \*